(12) United States Patent
Ma et al.

(10) Patent No.: US 10,877,121 B2
(45) Date of Patent: Dec. 29, 2020

(54) SYSTEM AND METHOD FOR MAGNETIC RESONANCE FINGERPRINTING WITH REDUCED ACOUSTIC NOISE

(71) Applicant: Case Western Reserve University, Cleveland, OH (US)

(72) Inventors: Dan Ma, Solon, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 37 days.

(21) Appl. No.: 16/416,811

(22) Filed: May 20, 2019

(65) Prior Publication Data

US 2019/0353737 A1   Nov. 21, 2019

Related U.S. Application Data (60) Provisional application No. 62/673,820, filed on May 18, 2018.

(51) Int. Cl.
| | |
|---|---|
| *G01R 33/56* | (2006.01) |
| *G01R 33/50* | (2006.01) |
| *G01R 33/48* | (2006.01) |
| *G01R 33/54* | (2006.01) |

(52) U.S. Cl.
CPC ..... *G01R 33/5608* (2013.01); *G01R 33/4828* (2013.01); *G01R 33/50* (2013.01); *G01R 33/543* (2013.01)

(58) Field of Classification Search
USPC .......................................................... 324/309
See application file for complete search history.

(56) References Cited

U.S. PATENT DOCUMENTS

| | | | |
|---|---|---|---|
| 8,723,518 B2 | 5/2014 | Seiberlich | |
| 10,222,441 B2* | 3/2019 | Kaditz | ................... G01R 33/48 |
| 10,321,845 B2* | 6/2019 | Amthor | .............. A61B 5/14532 |
| 10,359,486 B2* | 7/2019 | Kaditz | ................... G01N 24/08 |
| 2015/0301141 A1 | 10/2015 | Griswold | |
| 2015/0302842 A1 | 10/2015 | Griswold | |
| 2018/0031653 A1* | 2/2018 | Boernert | ................ G01R 33/54 |
| 2018/0180692 A1* | 6/2018 | Amthor | ................... G01R 33/30 |
| 2018/0238983 A1* | 8/2018 | Cohen | ................... G01R 33/543 |

OTHER PUBLICATIONS

Alibek S, et al. Acoustic noise reduction in MRI using Silent Scan: An initial experience. Diagnostic Interv. Radiol. 2014;20:360-363. doi: 10.5152/dir.2014.13458.

(Continued)

*Primary Examiner* — Rodney E Fuller
(74) *Attorney, Agent, or Firm* — Quarles & Brady LLP (57) ABSTRACT

A method for magnetic resonance fingerprinting (MRF) with reduced acoustic noise includes accessing a MRF dictionary using a magnetic resonance imaging (MRI) system, acquiring MRF data using the MRI system and a pulse sequence comprising a plurality of arbitrary gradient waveforms for each gradient axis and random repetition times to control acoustic noise, comparing the MRF data to the MRF dictionary to identify at least one parameter of the MRF data and generating a report indicating the at least one parameter of the MRF data.

24 Claims, 4 Drawing Sheets

(56) References Cited

OTHER PUBLICATIONS

Grodzki DM, et al. Ultrashort Echo Time Imaging Using Pointwise Encoding Time Reduction With Radial Acquisition ( Petra ). Magn. Reson. Med. 2012;67:510-518. doi: 10.1002/mrm.23017.
Heismann B, et al. Sequence-based acoustic noise reduction of clinical MRI scans. Magn. Reson. Med. 2015;73:1104-1109. doi:10.1002/mrm.25229.
Hennel F. Fast spin echo and fast gradient echo MRI with low acoustic noise. J. Magn. Reson. Imaging 2001;13:960-966. doi: 10.1002/jmri.1138.
Jiang Y, et al. MR fingerprinting using fast imaging with steady state precession (FISP) with spiral readout. Magn. Reson. Med. [Internet] 2014;0:n/a-n/a. doi: 10.1002/mrm.25559.
Ma D, et al. "Magnetic Resonance Fingerprinting," Nature, 2013; 495 (7440): 187-192.
Ma D, et al. Music-based magnetic resonance fingerprinting to improve patient comfort during MRI examinations. Magn. Reson. Med. [Internet] 2015. doi: 10.1002/mrm.25818.
Pauly J, et al. A k-space analysis of small-tip-angle excitation. J. Magn. Reson. 1989;81:43-56. doi: 10.10161/j.imr.2011.09.023.

\* cited by examiner

SYSTEM AND METHOD FOR MAGNETIC RESONANCE FINGERPRINTING WITH REDUCED ACOUSTIC NOISE

CROSS-REFERENCE TO RELATED APPLICATION

This application is based on, claims priority to, and incorporates herein by reference in its entirety U.S. Ser. No. 62/673,820 filed May 18, 2018, and entitled "System And Method For Quantitative Magnetic Resonance Imaging With Reduced Noise."

STATEMENT REGARDING FEDERALLY SPONSORED RESEARCH

This invention was made with government support under EB026764, NS109439, EB016728 and EB017219 awarded by the National Institutes of Health. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," Nature, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weighting or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

MRF scans have shown high scan efficiency and repeatability on quantifying tissue properties, such as T1 and T2 values. However, acoustic noise is produced during an MRF scan. The acoustic noise may be, for example, loud banging noises and may be uncomfortable for patients, technicians, doctors and anyone else in the vicinity of the MRF apparatus. In addition, because fast switching gradients for the slice encoding and spiral readout are typically applied in MRF, the acoustic noise generated from an MRF scan is louder than the routine clinical MR scans. For example, an MRF scan has an average sound pressure level (aSPL) of 88.4 dB and maximum sound pressure level (mSPL) of 90.3 dB from an MRF scan, as compared to aSPL of 84.1 dB and mSPL of 85.8 dB for a diffusion scan and aSPL of 81.4 dB and mSPL of 83.5 for a TSE scan.

It would be desirable to provide a system and method to reduce the acoustic noise generated by an MRF scan.

SUMMARY OF THE DISCLOSURE

In accordance with an embodiment, a method for magnetic resonance fingerprinting (MRF) with reduced acoustic noise includes accessing a MRF dictionary using a magnetic resonance imaging (MM) system, acquiring MRF data using the MM system and a pulse sequence comprising a plurality of arbitrary gradient waveforms for each gradient axis and random repetition times to control acoustic noise, comparing the MRF data to the MRF dictionary to identify at least one parameter of the MRF data and generating a report indicating the at least one parameter of the MRF data.

In accordance with another embodiment, a magnetic resonance fingerprinting (MRF) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The MRF system also includes a computer system programmed to access a MRF dictionary, acquire MRF data using a pulse sequence to control the magnet gradient system and the RF system, the pulse sequence comprising a plurality of arbitrary gradient waveforms for each gradient axis and random repetition times to control acoustic noise, compare the MRF data to the MRF dictionary to identify at least one parameter of the MRF data and generate a report indicating the at least one parameter of the MRF data.

DETAILED DESCRIPTION

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha, \phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_1(T_1,T_2,D)$, may also include additional terms, $E_i(T_1,T_2,D, \ldots)$ or may include fewer terms, such as by not including the diffusion relaxation, as $E_i(T_1,T_2)$ or $E_i(T_1, T_2, \ldots)$. Also, the summation on "j" could be replace by a product on "j". The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

Figure 1:
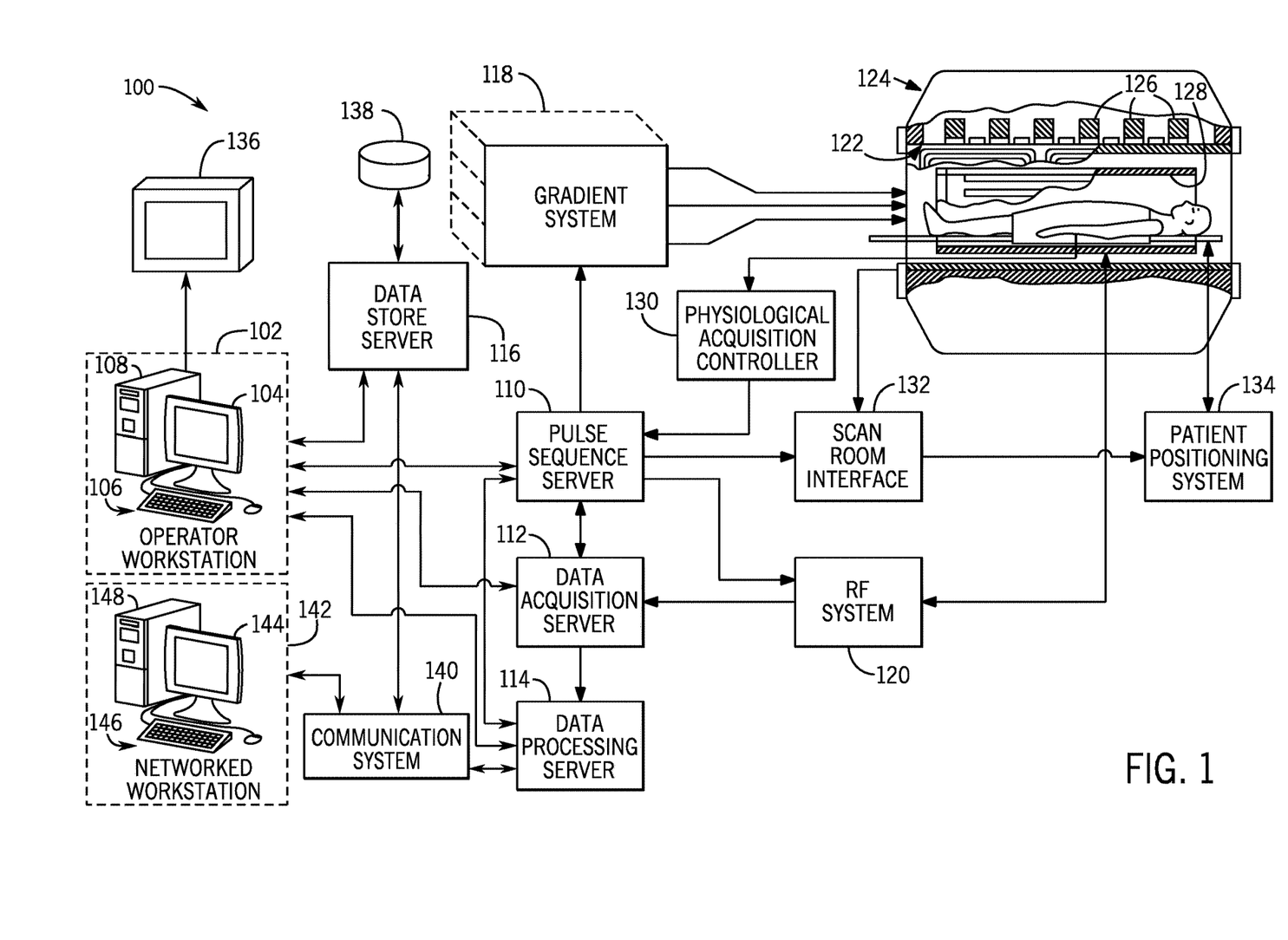
FIG. 1 is a schematic diagram of an example MM system in accordance with an embodiment.

To achieve this process, a magnetic resonance imaging (MRI) system or nuclear magnetic resonance (NMR) system may be utilized. FIG. 1 shows an example of an MM system 100 that may be used to perform magnetic resonance fingerprinting. In addition, MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MM pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

Figure 2:
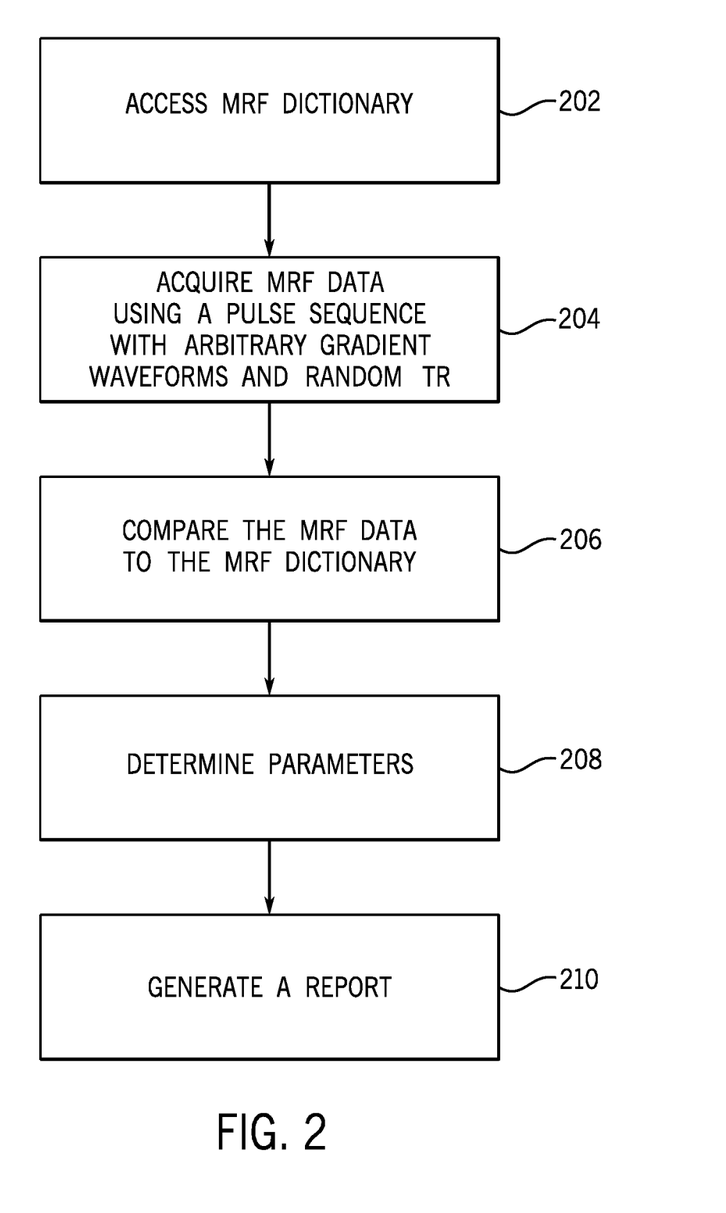
FIG. 2 illustrates a method for magnetic resonance fingerprinting with reduced acoustic noise in accordance with an embodiment.

As mentioned above, for MRF a pulse sequence may be performed using a series of varied sequence blocks to elicit MR signals (and signal evolutions) from each image element (e.g., a pixel or voxel) from a region of interest. The present disclosure describes a method for MRF that utilizes arbitrary gradient waveforms and random repetition times (TR) in an MRF pulse sequence (and the series of sequence blocks) to reduce acoustic noise while still providing quantitative information such as T1 and T2 values. FIG. 2 illustrates a method for magnetic resonance fingerprinting with reduced acoustic noise in accordance with an embodiment. At block 202, a MRF dictionary is accessed. The MRF dictionary may be stored in memory or data storage of, for example, an MRI system (e.g., the MRI system 100 of FIG. 1) or other computer system. As used herein, the term "accessing" may refer to any number of activities related to generating, retrieving or processing the MRF dictionary using, for example, MRI system 100 (shown in FIG. 1), an external network, information repository, or combinations thereof. The MRF dictionary includes known signal evolutions (e.g., simulated signal evolutions).

Figure 3:
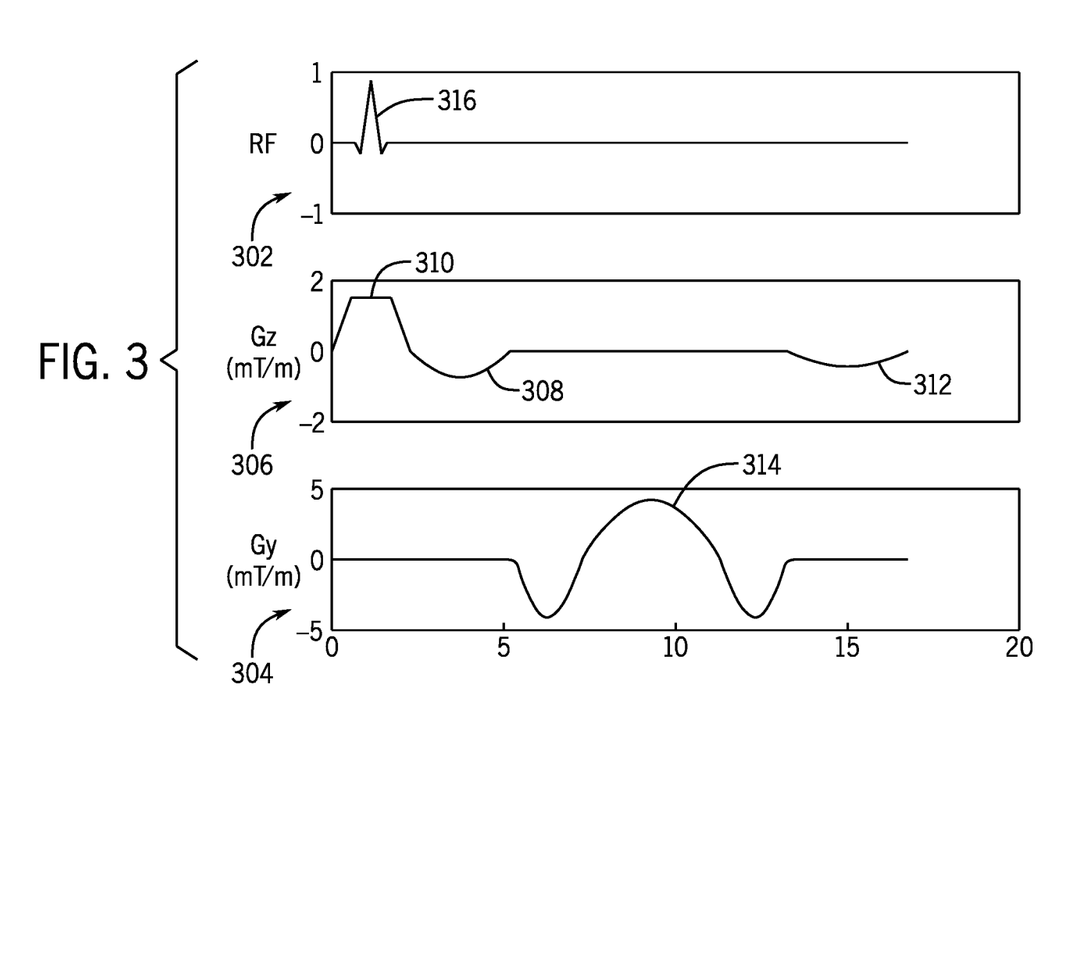
FIG. 3 shows radio frequency (RF) and gradient waveforms for a repetition time (TR) in accordance with an embodiment.

At block 204, MRF data is acquired from tissue in a region of interest in a subject using, for example, an MRI system (e.g., MRI system 100 shown in FIG. 1). The MRF data may be acquired using a pulse sequence such as, for example, Fast Imaging with Steady-State Free Precession (FISP), FLASH, TrueFISP, gradient echo, spin echo, etc. To reduce acoustic noise during an MRF scan, the MRF pulse sequence utilizes arbitrary gradient waveforms for each gradient axis. FIG. 3 shows radio frequency (RF) and gradient waveforms for a repetition time (TR) in accordance with an embodiment. In FIG. 3, a design if an RF pulse 302 and gradient waveforms on a $G_y$ axis 304 and $G_z$ axis 306 for one TR are shown. For each gradient axis, an arbitrary gradient design is used for each TR. In one embodiment, the gradient waveforms vary in at least two TRs. In another embodiment, the gradient waveforms vary in each TR, for example, from one TR to the next. Each gradient waveform may have random characteristics or parameters such as, for example, shape, amplitude and duration. In an embodiment, a maximum gradient strength (or amplitude) or a maximum slew rate (e.g., a threshold) for the arbitrary gradient waveforms may be predetermined. The predetermined threshold for the maximum gradient strength or maximum slew rate may then be used in the design and generation of the arbitrary gradient waveforms during performance of the pulse sequence.

In the embodiment shown in FIG. 3, a half-sine waveform with a slow slew rate is used for the gradients from all three axes such as, for example, waveform 308. Such gradient shapes may reduce the acoustic noise by slowing down the slew rate. In an embodiment, a balanced and smoothly varying waveform 314 is applied in $G_y$ axis 304. The resulting k-space trajectory is similar to a radial trajectory but with varying step size along the radial direction. In an embodiment, a spoiling gradient 312 with half-sine shape may be applied to achieve $4\pi$ dephasing along across a partition thickness.

A trapezoidal slice selection gradient 310 with low amplitude and slow slew rate may be used in each TR to ensure a consistent slice encoding and a good slice profile. Each slice selection gradient may also have a varying duration. In an embodiment, the ramp up and ramp down times for the slice selection gradient 310 is also used for excitation. Accordingly, the RF pulse 316 for each TR may be designed as a variable rate selective excitation (VERSE) pulse based on the varying gradient shape. In addition, randomized timing including, for example, RF pulse duration, slice encoding time, readout time and total TR time is applied so that the noise spectrum is distributed and does not excite any acoustic resonances in the MIII system (e.g., MIII system 100 shown in FIG. 1). In one embodiment, at least one timing parameter such as total TR time, gradient duration, etc, is varied in at least two TRs. In another embodiment, at least one timing parameter is varied in each TR, for example, from one TR to the next. In an embodiment, the MRF pulse sequence is implemented as a three-dimensional (3D) MRF scan with slab selective excitation to provide a volumetric coverage. The amplitude of a slice selective gradient 310 is also much lower when a large slab is excited so that the acoustic noise from the gradient 310 may be substantially reduced. In another embodiment, the noise level may be further reduced by using a non-selective 3D scan with no slice encoding gradient or using continuous gradients with minimum gradient steps.

Returning to FIG. 2, the MRF data acquired at block 204 is stored and compared to the MRF dictionary at block 206 to match the acquired signal evolutions with signal evolutions stored in the MRF dictionary. Comparing the MRF data to the MRF dictionary may be performed in a number of ways such as, for example, using a pattern matching, template matching or other matching algorithm. In one embodiment, the inner products between the normalized measured time course of each pixel and all entries of the normalized dictionary are calculated, and the dictionary entry corresponding to the maximum value of the inner product is taken to represent the closest signal evolution to the acquired signal evolution. At block 208, one or more parameters of the MRF data are determined based on the comparison and matching at block 206. The parameters may include, for example, longitudinal relaxation time (T1), transverse relaxation time (T2), main or static magnetic field ($B_0$) and proton density (PD). At block 210, a report may be generated indicating at least one of the identified parameters for the tissue in a region of interest in a subject. For example, the report may include a quantitative indication of the at least one parameter. The report may include, for example, images or maps, text or metric based reports, audio reports and the like. The report may be provided to a display (e.g., display 104, 136 or 144 shown in FIG. 1).

Figure 4:
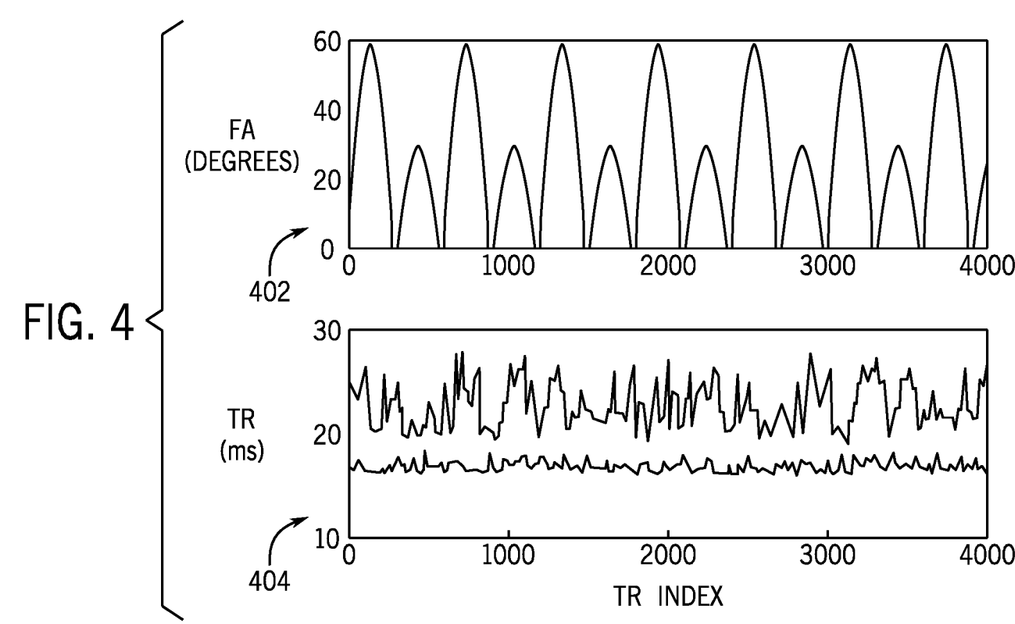
FIG. 4 shows example flip angle and repetition time (TR) patterns for an acquisition in accordance with an embodiment.

In an example, the MRF sequence with arbitrary gradient waveforms and randomi repetition times was evaluated using a phantom and an in vivo scan with a FOV of 300×300×80 mm³ performed in a 3T MRI system. For each partition, 400 time-points were acquired and a flip angle (FA) pattern 402 and a TR pattern 404 as shown in FIG. 4 was used. The acquisition time was 76 seconds per partition. The RF pulse at each TR was designed to have the same slice profile as a sinc pulse with a duration of 2000 us and a time bandwidth product of 8. A balanced and smoothly varying waveform (e.g., waveform 314 shown in FIG. 3) was applied in $G_y$ in each TR. The resulting k-space trajectory was similar to the radial trajectory but with varying step size along the radial direction. Only one such radial trajectory was used to reconstruct an image in each TR, which leads to an undersampling factor of around 400. This gradient with randomized duration was rotated at a golden-angle from one TR to the next. At the end of each TR, a spoiling gradient with a half-sine shape (e.g., gradient 312 as shown in FIG. 3) was applied to achieve a $4\pi$ dephasing across the partition thickness.

In this example, the aSPL and mSPL values of all scans were measured in the scanner room and the measurement time for each scan was 40 seconds. The measured aSPL and mSPL values for the MRF scan described in this example were 69.8 dB and 72.3 dB, respectively. These measured values are similar to a conventional quiet T2-weighted scan which has an aSPL of 70.1 dB and mSPL of 71.9 dB. In another comparison, the aSPL and mSPL from another conventional quiet scan (T1w-PETRA) is 56.6 dB and 58.3 dB, respectively, and the ambient aSPL and mSPL from the scanner room without any scanning is 56.2 dB and 58.0 dB, respectively.

Computer-executable instructions for magnetic resonance fingerprinting with reduced acoustic noise according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly states, are possible and within the scope of the invention.

The invention claimed is:

1. A method for magnetic resonance fingerprinting (MRF) with reduced acoustic noise comprising:
    accessing a MRF dictionary using a magnetic resonance imaging (MRI) system;
    acquiring MRF data using the MRI system and a pulse sequence comprising a plurality of arbitrary gradient waveforms for each gradient axis and random repetition times to control acoustic noise;
    comparing the MRF data to the MRF dictionary to identify at least one parameter of the MRF data; and
    generating a report indicating the at least one parameter of the MRF data.

2. The method according to claim 1, wherein acquiring MRF data using the MRI system and the pulse sequence further comprises generating each of the plurality of arbitrary gradient waveforms based at least on a predetermined maximum gradient strength.

3. The method according to claim 1, wherein acquiring MRF data using the MRI system and the pulse sequence further comprises generating each of the plurality of arbitrary gradient waveforms based at least on a predetermined maximum gradient slew rate.

4. The method according to claim 1, wherein at least one parameter of the arbitrary gradient waveforms for a gradient axis is varied in at least two repetition times.

5. The method according to claim 4, wherein the at least one parameter is varied in each repletion time.

6. The method according to claim 4, wherein the at least one parameter is a gradient waveform shape.

7. The method according to claim 4, wherein the at least one parameter is a duration of the gradient waveform.

8. The method according to claim 4, wherein the at least one parameter is an amplitude of the gradient waveform.

9. The method according to claim 1, wherein at least one of the plurality of arbitrary gradient waveforms for a gradient axis is a half-sine waveform.

10. The method according to claim 1, wherein at least one of the plurality of arbitrary gradient waveforms for a gradient axis is a balanced and smoothly varying waveform.

11. The method according to claim 1, wherein the pulse sequence further comprises a variable rate selective excitation (VERSE) radio frequency (RF) pulse.

12. The method according to claim 1, wherein the pulse sequence further comprises at least one of a plurality of random RF pulse durations, a plurality of random slice encoding times or a plurality of random readout times.

13. A magnetic resonance fingerprinting (MRF) system comprising:
    a magnet system configured to generate a polarizing magnetic field about at least a portion of a subject;
    a magnetic gradient system including a plurality of magnetic gradient coils configured to apply at least one magnetic gradient field to the polarizing magnetic field;
    a radio frequency (RF) system configured to apply an RF field to the subject and to receive magnetic resonance signals from the subject using a coil array; and
    a computer system programmed to:
    access a MRF dictionary;
    acquire MRF data using a pulse sequence to control the magnet gradient system and the RF system, the pulse sequence comprising a plurality of arbitrary gradient waveforms for each gradient axis and random repetition times to control acoustic noise;
    compare the MRF data to the MRF dictionary to identify at least one parameter of the MRF data; and
    generate a report indicating the at least one parameter of the MRF data.

14. The method according to claim 13, wherein the computer system is further programmed to generate each of the plurality of arbitrary gradient waveforms based at least on a predetermined maximum gradient strength.

15. The method according to claim 13, wherein the computer system is further programmed to generate each of the plurality of arbitrary gradient waveforms based at least on a predetermined maximum slew rate.

16. The method according to claim 13, wherein at least one parameter of the arbitrary gradient waveforms for a gradient axis is varied in at least two repetition times.

17. The method according to claim 16, wherein the at least one parameter is varied in each repletion time.

18. The method according to claim 16, wherein the at least one parameter is a gradient waveform shape.

19. The method according to claim 16, wherein the at least one parameter is a duration of the gradient waveform.

20. The method according to claim 16, wherein the at least one parameter is an amplitude of the gradient waveform.

21. The method according to claim 13, wherein at least one of the plurality of arbitrary gradient waveforms for a gradient axis is a half-sine waveform.

22. The method according to claim 13, wherein at least one of the plurality of arbitrary gradient waveforms for a gradient axis is a balanced and smoothly varying waveform.

23. The method according to claim 13, wherein the pulse sequence further comprises a variable rate selective excitation (VERSE) radio frequency (RF) pulse.

24. The method according to claim 13, wherein the pulse sequence further comprises at least one of a plurality of random RF pulse durations, a plurality of random slice encoding times or a plurality of random readout times.

* * * * *

UNITED STATES PATENT AND TRADEMARK OFFICE
CERTIFICATE OF CORRECTION

PATENT NO. : 10,877,121 B2  
APPLICATION NO. : 16/416811  
DATED : December 29, 2020  
INVENTOR(S) : Dan Ma et al.

Page 1 of 1

It is certified that error appears in the above-identified patent and that said Letters Patent is hereby corrected as shown below:

In the Specification

Column 2, Line 29, "(MM)" should read --(MRI)--.

Column 2, Line 30, "MM" should read --MRI--.

Column 2, Line 57, "MM" should read --MRI--.

Column 5, Line 6, "MM" should read --MRI--.

Column 5, Line 46, "MM" should read --MRI--.

Column 8, Line 28, "the Mill System (e.g., Mill system" should read --the MRI system (e.g., MRI system--.

Signed and Sealed this  
Sixteenth Day of March, 2021

Drew Hirshfeld  
*Performing the Functions and Duties of the  
Under Secretary of Commerce for Intellectual Property and  
Director of the United States Patent and Trademark Office*